United States Patent [19]
Smith

[11] 4,055,815
[45] Oct. 25, 1977

[54] Q-SWITCHING INJECTION LASER WITH OXYGEN IMPLANTED REGION

[75] Inventor: Archibald W. Smith, Briarcliff Manor, N.Y.

[73] Assignee: International Business Machines, Armonk, N.Y.

[21] Appl. No.: 643,972

[22] Filed: Dec. 24, 1975

[51] Int. Cl.² .............................................. H01S 3/19
[52] U.S. Cl. ......................... 331/94.5 H; 331/94.5 Q
[58] Field of Search ..................... 331/94.5 H, 94.5 P, 331/94.5 PE, 94.5 Q, 94.5 M; 330/4.3; 307/88.3, 312; 357/18

[56] References Cited

U.S. PATENT DOCUMENTS 3,654,497  4/1972  Dyment et al. ................. 331/94.5 X

OTHER PUBLICATIONS

Favennec et al., Applied Physics Letters, vol. 23, No. 10, Nov. 1973, pp. 546–547.
Keyes et al., IBM Tech. Discl. Bull., vol. 8, No. 1, June 1965, pp. 183–184.

*Primary Examiner*—Stanley D. Miller, Jr.
*Assistant Examiner*—James W. Davie
*Attorney, Agent, or Firm*—Pollock, Vande Sande & Priddy

[57] ABSTRACT

A Q-switching injection laser is disclosed which includes integral emitter and saturable absorber sections of the semiconductive body. In one embodiment the emitter and absorber sections are separated by an interface region implanted with ions of a type and amount to significantly increase the resistivity at the interface. Preferably, the implanted ions have energy levels spaced far enough from the conduction and valence bands of the semiconductive body such that charge carriers cannot be thermally excited between the conduction or valence bands and the energy level of the implanted ions. In another preferred embodiment, the saturable absorber section includes implanted ions of type and amount to increase the resistivity of the region, as compared to the emitter region, so as to give saturable absorber characteristic under available pumping conditions. Likewise, preferably the implanted ion is selected such that its energy levels are sufficiently separated from the valence and conduction bands so as to prevent thermal excitation from transferring charge carriers between valance and conduction bands and the energy levels of the implanted ion. In a specific embodiment, in a GaAs injection laser doped with Ge or Si, the implanted ion may be selected from the group including O, Cr and Fe.

7 Claims, 13 Drawing Figures

Q-SWITCHING INJECTION LASER WITH OXYGEN IMPLANTED REGION

FIELD OF THE INVENTION

The present invention relates to Q-switching injection lasers and more particularly relates to such a laser which is simpler to fabricate and more effective than those suggested in the prior art.

BACKGROUND OF THE INVENTION

The prior art has reported fabrication and testing of multiple laser devices comprising a laser having emitter characteristics and another laser having saturable absorber characteristics. Such a combination, when optically coupled and placed in a resonant cavity, is capable of Q-switching action in which it produces short optical pulses of relatively high repetition rate. For instance, optical pulses having a duration of a fraction of a nanosecond, at a repetition frequency reaching several gigacycles, have been reported. Such devices may well have substantial utility in optical communications systems for providing what corresponds to a "carrier" upon which information can be transmitted by selectively deleting certain of the optical pulses.

Solid state devices of this sort have been disclosed by Kosonocky, U.S. Pat. No. 3,270,291 and Fowler, U.S. Pat. NO. 3,303,431.

One disadvantage to the device disclosed in the above referenced prior art is that the emitter laser and saturable absorber laser were separated and, therefore, the combination exhibited losses in coupling light from one to the other section. Lasher, however, in U.S. Pat. NO. 3,427,563 as well as Basov et al. in "Investigations of GaAs Laser Radiation Pulsations" appearing in soviet Physics— Semi-conductors, Vol. 1, No. 10, April 1968 (beginning at page 1305), disclose a combination of the type described which is formed from an integral monocrystalline semiconductor. Since the emitter and absorber sections were different regions in a single crystal, the different characteristics of these regions were obtained by pumping them with current at different levels. To prevent pumping current intended for the emitter section from leaking to the saturable absorber section, two different contacts were employed, one overlaying the emitter section and the other overlaying the saturable absorber section. In addition, a slot was cut into the semi-conductive body to act as an insulator. In practice the slot is difficult to cut properly, for it must be cut deep enough to inhibit conduction between the two regions, but at the same time not so deep as to interfere with optical properties of the device. Although the device has an active lasing region to which the optical signal is confined, it is not sufficient to stop the slot short of the active region for the characteristics of the active region depend upon, for instance, the index of refraction of the adjacent regions. If the slot extends up to the active region light can leak out through the slot. On the other hand, if the slot is stopped far enough short of the active region to prevent light leakage, conductive leakage is possible.

Furthermore, the requirment of the plurality of contacts on the body, as in Lasher, is also not desirable, although it is feasible to produce such a device. On the other hand, it would make fabrication of the device easier if only single contact were required to transmit the pumping current from the pumping source to the laser device.

It is therefore one object of the present invention to provide an integral laser capable of Q-switching which does not require slotting or cutting of the body to insulate an emitter section from an absorber section. It is another object of the present invention to provide a Q-switching solid state laser having emitter and absorber sections in which the selections are insulated from each other. It is still another object of the present invention to provide such a device capable of controllable and repetitive Q-switching. It is still another object of the present invention to provide a device of the foregoing nature which admits of relatively simpler manufacture than that found in the prior art.

SUMMARY OF THE INVENTION

These and other objects of the invention are met by providing a Q-switching solid state injection laser having integral emitter and absorber sections located in a resonant cavity, including a monocrystalline semi-conductor body with a p-n junction parallel to opposed major surfaces of the body. This body includes an implanted region defining the extent of the emitter and absorber sections. The insulating region is implemented by implanting ions of a type and amount so as to increase the resistivity of the region. The ion is further selected so that it will provide energy levels sufficiently widely separated from the conduction and valence bands to prevent thermal excitation from transferring charge carries from either the conduction or valence band to or from the energy levels of the implanted ion. In one embodiment the implanted region defines the interface between the emitter and absorber sections. In this embodiment the amount of ion implantation is selected so as to greatly increase the resistivity of the interface region to substantially prevent current flow across the interface from one section to another.

In another embodiment of the invention substantially the entire absorber section comprises a region having implanted ions therein. In this embodiment the type and amount of implanted ions are selected so as to controllably increase the resistivity of the region to achieve the desired absorber characteristic. The ion is selected, as to type, so as to ensure that its energy levels are sufficiently widely separated from conduction and valence bands to substantially prevent thermal excitation from transferring charge carriers from or to the conduction or valence bands and the energy levels of the ion. In this embodiment a single current injecting contact may be provided on the laser, providing sufficient current to the emitter section of the laser to result in the necessary gain characteristic. The controlled increase in resistivity of the absorber section results in presenting the characteristics of a saturable absorber.

In specific embodiments, employing a GaAs semiconductor doped with Ge or Si, the implanted ion was selected from the group including O, Cr and Fe, and more particularly was O.

BRIEF DESCRIPTION OF THE DRAWINGS

The invention will now be described in conjunction with the attached drawings in which like reference characters identify identical apparatus and, in which.

DETAILED DESCRIPTION OF THE INVENTION

Figure 1A:
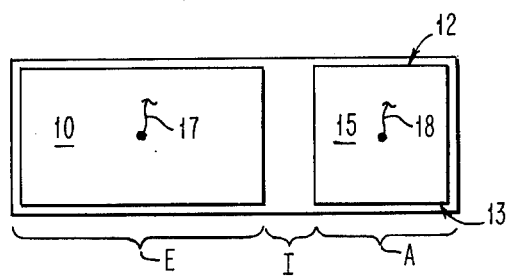
FIGS. 1A–1C are, respectively, top, end and side views of one embodiment of the invention.
Figure 1C:
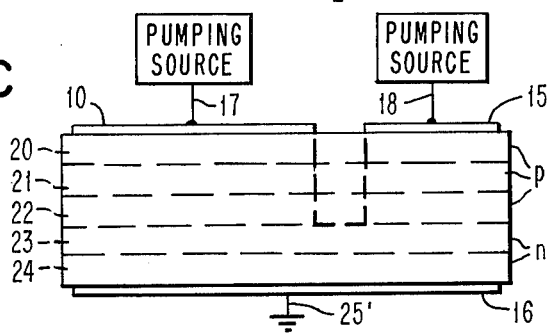
Figure 1B:
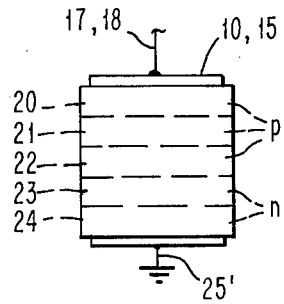

FIGS. 1A, 1B and 1C show respectively, top, edge and side views of one embodiment of the inventive device, comprising a solid state Q-switching laser having integral emitter and absorber sections. As illustrated in FIGS. 1A through 1C the device is integral in that it comprises a monocrystalline semiconductor which is doped to provide a plurality of regions of one and the opposite conductivity type including at least one active lasing region. As shown in FIGS. 1B and 1C, the semiconductor actually comprises five regions, regions 20, 21 and 22 carry p doping while regions 23 and 24 are n-doped. This structure is described in more detail in an article by Blum et al. entitled "Oxygen Implanted Double Heterojunction GaAs/GaAlAs, Injection Lasers" dated July 1975, and appearing in IEEE J. of Quantum of Electronics, Vol. 11, p. 413–20. Briefly, the uppermost layer, layer 20, is Ge doped GaAs, layer 21 is Ge doped GaAlAs, layer 22, the active lasing region, is Si doped GaAlAs, region 23 is Te doped GaAlAs and region 24 is Si doped GaAs, wherein 24 is normally the substrate on which the other layers are built. In addition to disclosing the composition of this laser the above referenced article also teaches the manner of its manufacture as well as the relative carrier concentrations in each of the different regions. Those or ordinary skill in the art will understand that a five layered semic-conductive laser is not required and that as little as two regions, i.e., sufficient to provide a p-n junction, can be employed, as well as employing materials other than those specified above. The active layer includes a laser material have two energy states which are separated by an amount corresponding to a characteristic frequency of the lasing material. The lasing material has the property of being excitable into an inverted population density condition, i.e., an excess population can be established in one of its upper energy states. The active material may emit substantial coherent radiation as the atomic particles return from the higher energy level to a lower energy level.

As is shown in FIGS. 1A through 1C the laser device includes a pair of contacts 10 and 15, on a major surface of the crystal, which are connected to leads 17 and 18, respectively, for attachment to a pumping source or sources for exciting the molecules or ions in the active lasing region from a lower energy level to one of the desired higher energy levels. The pumping circuit is completed through contact 16 on another major surface of the crystal, which can be grounded via lead 25'.

In order to produce coherent radiation the laser device is positioned in a resonant optical cavity. To implement this the semi-conductive body is prepared to have a pair of end faces parallel and highly reflective, and the other surfaces are suitable for diffuse scattering. Normally, the highly reflective end faces are realized simply by cleaving the crystal along a certain crystallographic plane, which in GaAs is the (110) plane.

Certain portions of the operation of the inventive device are conventional in that the pumping sources conductively connected to their respective leads 17 and 18 energize the active lasing material to establish the inverted population condition. As the atomic particles are returned to a lower energy level, light is produced. The light may be visible or invisible. The light may then pass through the partially transparent reflectors and exit.

Integrally associated with the emitting section E of the laser device, which emitter section is characterized by an amplification factor, is a saturable absorber section A. Since the saturable absorber A is integral with the semi-conductor body, radiation produced by the body must travel through the saturable absorber. The saturable absorber is designed so as to absorb a large percentage of light until it saturates. At that point, the saturable absorber is ineffective to absorb further light. As a result, transmission of the absorber section increases dramatically. The initial amount of absorption is controlled by the pumping source connected to lead 18, namely, more current through section A will decrease the absorption. In operation the emitter section is driven by the pumping source connected thereto, relatively hard to saturate the absorber section. Until the absorber section saturates stimulated emission is prevented. When the absorber section ceases to absorb, the laser suddenly, and quickly, switches to a condition in which it is far above the threshold level for stimulated emission. As a result, stimulated emission occurs and an optical pulse is produced. Subsequent to emission of the aforementioned pulse, and in order to produce that pulse, the inverted population density substantially reverts to a lower energy state. Assuming that the emitter and absorber sections remain driven, the entire cycle repeats itself with, first, the absorber section becoming saturated.

Since the laser body is monocrystalline, the respective physical structures of the emitter and absorber sections are substantially identical. Thus, it is the amplitude of the different pumping sources which determine whether or not the associated section will be an emitter or an absorber, and the extent of that characteristic. It should be apparent, therefore, that insulation or other differentiation means is required to prevent current flow between emitter absorber sections in order to attain controllable characteristics of the Q-switching device.

To provide this insulation in this embodiment an insulating region I is provided. This is a region in which an ion has been implanted, subsequent to growing the body of the laser. The particular ion selected and the amount of its implantation depend upon the required characteristcs of the insulating region, and the extent to which the body had previously been doped. To provide effective insulation the doping density of the implanted ion, should be at least several times greater than the highest doping density theretofore present in the region to be made insulating. Another requirement important for selection of the implanted ion is that, when implanted the energy level (or levels it provides should be sufficiently widely separated from the conduction and valence bands of the charge carriers to prevent thermal excitation from transferring charge carriers from or to the conduction and valence bands to the energy of the implanted ion. Furthermore, since the function of the implanted ion is to prevent leakage current from flowing between the emitter and absorber sections the implanation need not go beyond the upper portion of the active lasing region, i.e., layers 20–22. See the dotted lines in FIG. 1C showing the extent of the insulating region. FIG. 1C shows the desired implanation region. With present techniques, however, the implanted region may actually extend beyond that shown although the dosage will gradually decrease. This extension of the implanted region is not detrimental to device operation. For the GaAs laser which has been disclosed as an exemplary embodiment, the implanted ion can be selected from the group of O, Cr or Fe. A particular embodiment which has been constructed employed O implanation. Specifically the material used for this device is a four layer liquid phase epitaxy double heterostructure grown on an n-type silicon doped <100> oriented GaAs substrate with a carrier concentration of $1-2\times10^{18}$ cm$^{-3}$. A 8 um buffer layer, which is not shown on the figure, of tin or tellurium doped GaAs with a carrier concentration of $1\times10^{18}$ cm$^{-3}$ is first grown on the substrate in order to smooth out irregularities sometimes seen at the interface between the substrate and the subsequent layer. The next four layers are grown as shown in the figure using conventional liquid phase epitaxial techniques. The two GaAlAs layers above and below the silicon doped active layer contain 30% aluminum. The active layer contains as much as 10% aluminum in it.

A method of manufacturing a laser of the type disclosed above can employ the same procedures disclosed in the Blum et al. article mentioned above. Prior to deposition of the contacts 10 and 15, however, an implantation mask is deposited on the upper major surface of the crystal. This mask is structured so as to prevent implantation from taking place in the emitter and absorber sections. With this mask in place the selected ion is implanted in region I with a dose selected in accordance with the already discussed requirements. Subsequent to implantation, the mask may be removed and the contacts 10 and 15 deposited, as is illustrated in FIGS. 1A and 1B. Subsequent to deposition of the contacts 10 and 15, respectively suitable leads may be attached for connection to pumping sources. The oxygen implantation may also be used, with a different dosage, if necessary, to define the boundaries of the lasing region (referred to as "stripe" contact) marked 12, 13 in FIG. 1A. Such oxygen implantation enables a small lasing region to be imbedded in a convenient-sized semiconductor crystal. Since ion implantation is a known technique further description of the actual process of ion implantation is not believed necessary. In this regard see U.S. Pat. No. 3,655,457 and Favennec et al. "Compensation of GaAs by Oxygen Implantation" in Ion Implantation in Semiconductors and Other Materials, edited by Billy L. Crowder, Plenum Press, N.Y. 1973, pp. 621-30.

Figure 2A:
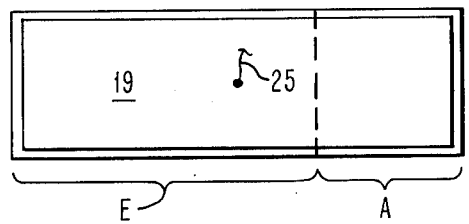
FIGS. 2A–2C are, respectively, top, end and side views of another embodiment of the invention.
Figure 2C:
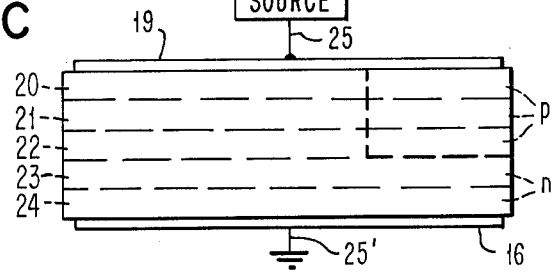
Figure 2B:
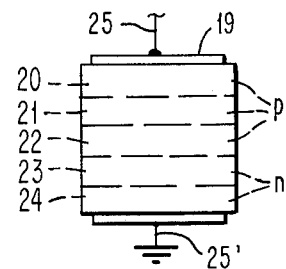

FIGS. 2A, 2B and 2C disclose, respectively, top, end and side views of another embodiment of the invention. This embodiment has a number of aspects which are in common with the embodiment illustrated in FIGS. 1A through 1C. Namely, the laser device includes emitter and absorber sections. However, a single conductive contact 19 is deposited in place of the two conductive contacts 10 and 15, illustrated in FIGS. 1A and 1C. Corresponding to the single conductive contact, a single lead 25 is conductively connected thereto. This lead may be connected to a pumping source for pumping the injection laser. Similar to the first embodiment, a plurality of regions of one and the opposite conductivity type comprise the body of the injection laser. More particular, FIGS. 2B and 2C illustrate that there are five different regions. As in the case with the first embodiment, however, a number of regions of one and the opposite conductivity type may be increased and/or decreased, so long as an active lasing region is included which can have electrons excited by the pumping source to a higher energy level so as to result in an inverted population density.

In constrast to the first embodiment, the entire saturable absorber section A is implanted with ions of a selected type and amount as shown within the dotted lines of FIGS. 2C. The characteristics which determine the type of ion to be selected are the same for this embodiment, as in the first embodiment. The amount of implantation is, however, determined on a different basis.

It was pointed out, with respect to the first embodiment, that it was the level of pumping current which determined whether a particular section of the laser was an emitter or absorber. In the embodiment of FIGS. 2A–2C, only a single pumping source is employed. As a result, if the resistivity of the laser body was uniform, the current through the p-n junction adjacent the lasing region would also be uniform. However, to achieve saturable absorber characteristics, the absorber section has had ion implantation effected in an amount to increase the resistivity of this section to result in the desired characteristics. Thus, while this embodiment includes an implanted region for defining the extent of the emitter and absorber sections, the extent of the implanted region is co-extensive with the saturable absorber section. Since a single conductive contact supplies pumping current to both the emitter and absorber sections, the potential difference across these sections will be identical. However, the current, and more importantly the current density across either the emitter or absorber section is determined by the resistivity of the material of that section. To give the absorber section the desired characteristics its resistivity is raised, by ion implantation, in proportion to the ratio between the pumping currents needed to give the desired emitter and absorber characteristic. In order to obtain this value of resistivity the implantation dose will be close or nearly equal to the doping of the material prior to implantation. From the foregoing description those skilled in the art will understand how a device, such as that disclosed, may be fabricated.

In still another embodiment, the implantation dosage is increased to the level which was employed in the first mentioned embodiment, i.e., to a level of such high resistivity that substantially no current flow through the implanted region. For instance the implanted dose is at least several times the doping density in the region prior to implantation. In this embodiment, which is also illustrated in FIGS. 2A-2C, the entire injection laser body is electroded, i.e., the electrode covers substantially the entire body. However, by reason of the high resistivity substantially no injection current flows in the absorber section A. Since no injection current is flowing in the absorption section, charge carriers will not be excited by any injection current. Rather, photons emitted by the emitter section E can excite charge carriers in the absorption section which reduces the absorption by trap filling effects. When the absorption section saturates, lasing action occurs, much in the same manner previously outlined.

Figure 3A:
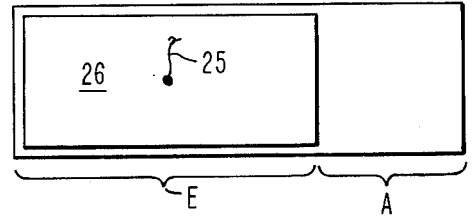
FIGS. 3A–3C are, respectively, top, end and side views of still another embodiment of the invention.
Figure 3C:
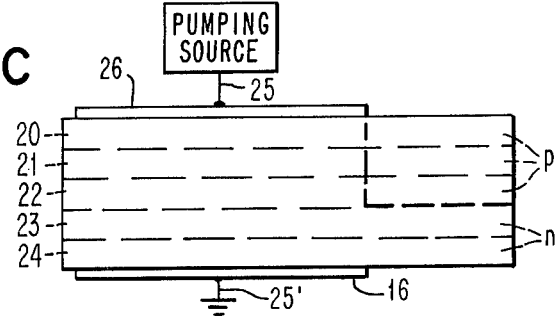
Figure 3B:
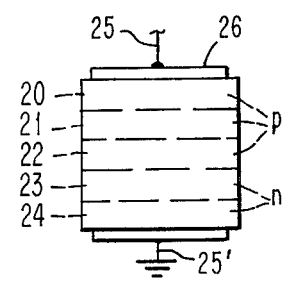

Still another embodiment of the invention is disclosed in FIGS. 3A-3C, in which the operation is substantially similar to that of the embodiment illustrated in FIGS. 2A-2C wherein the resistivity of the absorption section is so high that substantially no injection current flows. In this embodiment, however, only a portion of the injection laser body is electroded, i.e., that portion coextensive with the electrode 26, illustrated in FIGS. 3A-3C. At least a portion of the absorption section A is ion implanted to a sufficient level to prevent leakage current, from the emitter section, from flowing into the absorbtion section. To implement this, the entire absorption section A may be implanted with a dose that substantially raises the resistivity of the section. Alternatively, only a portion of the absorption section, adjacent the emitter section, need be implanted with substantially the same dosage. Either implementation prevents injection current from leaking from the emitter section to the absorption section. For example, the implanted dose in the entire absorption section, or in a region thereof directly adjacent the emitter section, will be at least several times the doping density of the region prior to implantation.

Figure 4A:
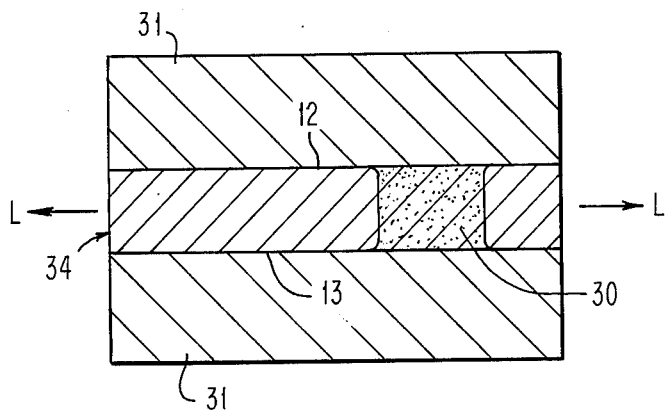
FIG. 4A is a section of a further embodiment shown in end and side views in FIGS. 4B and 4C respectively.
Figure 4C:
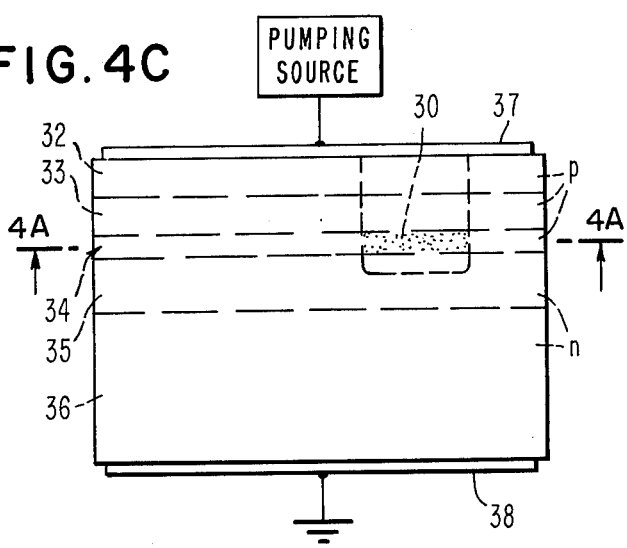
Figure 4B:
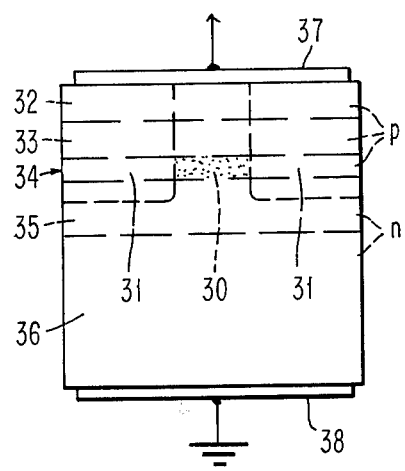

FIGS. 4A-4C illustate an embodiment of the invention that was made and operated. A high resistivity absorbing section 30 was formed by implanting 0 near one end of a stripe contact, GaAs/GaAlAs, double heterostructure laser. The implanted region was 25 um long and the laser was 250 um long. The lasing stripe 32 was also formed by oxygen implantation to render the side regions 31 highly resistive, as discussed by Blum et al. in the previously cited reference. For simplicity, both regions 30 and 31 were implanted with $1 \times 10^{14}$ 0 atoms/Cm$^2$ at an energy of 25 MeV, using a mask to prevent 0 atoms from reaching region 32.

The layer structure used to form the double heterostructure laser is shown in FIGS. 4B and 4C, and was as follows:

p-doped GaAs contact layer 32 (1.4 um thick), p-doped GaAlAs confining layer 33 (0.5 um thick), p-doped GaAs active layer 34 (0.3 um thick), n-doped GaAlAs confining layer 35 (1.5 um thick), and n-doped GaAs substrate 36. Laser light was emitted by the active layer 34 in the directions indicated by the arrows marked L in FIG. 4A. FIG. 4A represents the structure at plane 4A—4A of FIG. 4C.

Full electrodes 37 and 38 were applied to the semiconductor chip and connected to a pumping pulse generator. The experimental unit is similar to the structure of FIG. 2 with the absorber section 30 being of high resistance, except that the absorber section is near the middle of the lasting strip 32 instead of being at one end as shown in FIG. 2.

Figure 5:
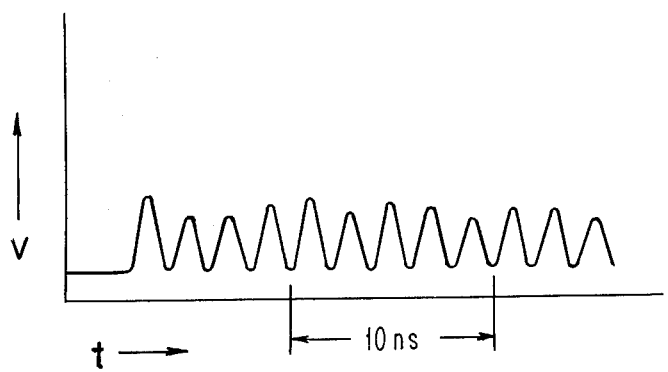
FIG. 5 is an amplitude-time plot of a Q-switched pulse train produced by the inventive laser.

The lasing output of this unit was observed with an optical detector and cathode-ray oscillascope whose response times were less than 0.5 n sec. At drive currents slightly above lasing threshold (appox. 220 ma), regular trains of pulses were obtained (as shown in FIG. 5) with frequencies in the range of 300–600 MHz. In a second unit, with a 50 um long absorber section, frequencies between 500 and 850 MHz were observed. The pulse repetition frequency was proportional to $\sqrt{(I_d/I_T)} - 1$, as would be expected on theoretical grounds where $I_d$ is the operating current and $I_T$ is the threshold current. (See N. G. Basov et al., Soviet Physics Uspekhi, Vol. 12, October 1969, pp. 219-240).

I claim:

1. A Q-switching GaAs injection laser comprising a mono-crystalline GaAs semiconductor body including distinct emitter and absorber sections with a single pumping source conductivity connected to a single electrode overlying said laser, said body including means defining a resonant cavity, wherein said electrode overlies both said emitter and absorber sections, said absorber section including implanted ions of a dose to provide a doping density at least about twice the doping density of the material prior to implantation so as to increase the resistivity of said absorber section, as compared to said emitter section, so that said respective absorber and emitter sections exhibit, respectively, absorber and emitter characteristics.

2. The laser of claim 1 wherein said ion implantation is sufficient to substantially prevent pumping current flow in said absorber section.

3. A Q-switching GaAs injection laser comprisng a mono-crystalline GaAs semiconductive body including at least one p-n junction with an active lasing region and having distinct emitter and saturable absorber sections, said body including means defining a resonant cavity, a single pumping means conductively connected to said body including a single electrode overlying said emitter section only, an ion implanted region in said absorber section, implanted with an ion selected from the group consisting of oxygen, chromium and iron, said implanted ion of a dose to provide said implanted region with a doping density at least several times the doping density of said region prior to implantation, said ion implantation dose sufficient to prevent pumping current from leaking from said emitter section to said absorber section.

4. The injection laser of claim 3 wherein said ion implanted region is confined to a region of said absorber section adjacent said emitter section.

5. A Q-switching injection laser comprising, a mono-crystalline semiconductive body including at least one p-n junction with an active lasing region having distinct emitter and saturable absorber sections, said body including means for defining a resonant cavity, pumping means conductively connected to said body including a single electrode overlying said laser, said saturable absorber section including an ion implanted region of a type, and an amount such that the doping density of said region is at least about twice the doping density of said region prior to implantation, to increase the resistivity of said implanted region, said ion source selected to provide energy levels sufficiently widely separated from the conduction and valence bands of said semiconductive body to prevent thermal excitation from transferring charge carriers from either the conduction or valence bands to or from the energy levels of the implanted ion, said ion implantation dosage of an amount to provide said saturable absorber section with a saturable absorber characteristic.

6. The laser of claim 5 wherein said electrode is coextensive with said emitter section, and said ion implantation dosage selected so as to substantially prevent pumping current from leaking from said emitter section to said absorber section.

7. The laser of claim 6 wherein said ion implantation region occupies a portion of said absorber section adjacent to the interface between said emitter and absorber sections.

* * * * *